(12) United States Patent
Yamada (10) Patent No.: US 7,355,425 B2
(45) Date of Patent: Apr. 8, 2008

(54) PROBE CARD CLAMP MECHANISM AND PROBE APPARATUS

(75) Inventor: Hiroshi Yamada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 18 days.

(21) Appl. No.: 11/521,476

(22) Filed: Sep. 15, 2006

(65) Prior Publication Data
US 2007/0063719 A1 Mar. 22, 2007

(30) Foreign Application Priority Data
Sep. 16, 2005 (JP) ............................. 2005-270791

(51) Int. Cl.
*G01R 31/02* (2006.01)
(52) U.S. Cl. ........................................ 324/754
(58) Field of Classification Search ............... 324/765, 324/754, 761, 762, 760, 158.1; 439/482, 439/483, 218, 219
See application file for complete search history.

(56) References Cited

U.S. PATENT DOCUMENTS 5,264,787 A * 11/1993 Woith et al. ............... 324/758
5,561,377 A * 10/1996 Strid et al. ................. 324/754
5,642,056 A * 6/1997 Nakajima et al. .......... 324/758

* cited by examiner

*Primary Examiner*—Ha Tran Nguyen
*Assistant Examiner*—Tung X. Nguyen
(74) *Attorney, Agent, or Firm*—Oblon, Spivak, McClelland, Maier & Neustadt, P.C.

(57) ABSTRACT

A clamp mechanism includes an insertion ring and a lock ring. The insertion ring includes a cylindrical portion and a flange portion. At the cylindrical portion, first cam followers to be inserted into a groove of the lock ring are arranged at predetermined intervals along a circumferential direction thereof, and at the flange portion, second cam followers to be in contact with the inner peripheral surface of the lock ring are arranged at predetermined intervals along a circumferential direction thereof. At the lock ring, cutoff portions, through which the first cam followers pass, are arranged corresponding to the first cam followers.

8 Claims, 11 Drawing Sheets

PROBE CARD CLAMP MECHANISM AND PROBE APPARATUS

FIELD OF THE INVENTION

The present invention relates to a probe card clamp mechanism and a probe apparatus; and, more particularly, to a probe card clamp mechanism and a probe apparatus, the mechanism having a simplified structure and capable of being easily assembled with the probe apparatus main body.

BACKGROUND OF THE INVENTION

Figure 9:
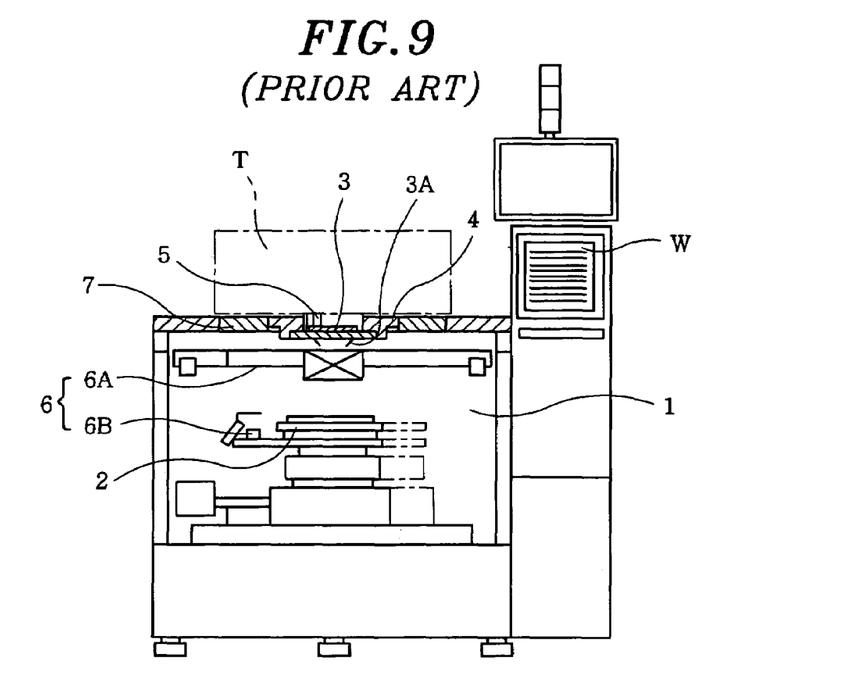
FIG. 9 is a front cutaway view showing main parts of a conventional probe apparatus.

As shown in FIG. 9, a conventional probe apparatus includes a probe apparatus main body 1; a mounting table 2, which is movably arranged in the probe apparatus main body 1 to move along X, Y, Z and ⊖ directions and on which an object to be inspected (for example, a wafer W) is mounted; a probe card 3 having probes 3A corresponding to electrode pads formed on the wafer W mounted on the mounting table 2; a clamp mechanism 4 (see FIGS. 10, 11A and 11B) for fixing the probe card 3 with a card holder (not shown); and a test head T electrically connected with the probe card 3 by a connection ring 5. The probe apparatus performs an electrical test on the wafer W by transmitting and receiving test signals between a tester (not shown) and the electrode pads on the wafer W with the test head T, the connection ring 5 and the probe card 3. Further, in FIG. 9, the reference numeral 6 represents a mechanism for enabling alignment between the wafer W and the probe card in cooperation with the mounting table, wherein the reference numerals 6A and 6B represent an upper and a lower camera, respectively. The reference numeral 7 represents a head plate on which the clamp mechanism 4 is fixed.

Figure 10:
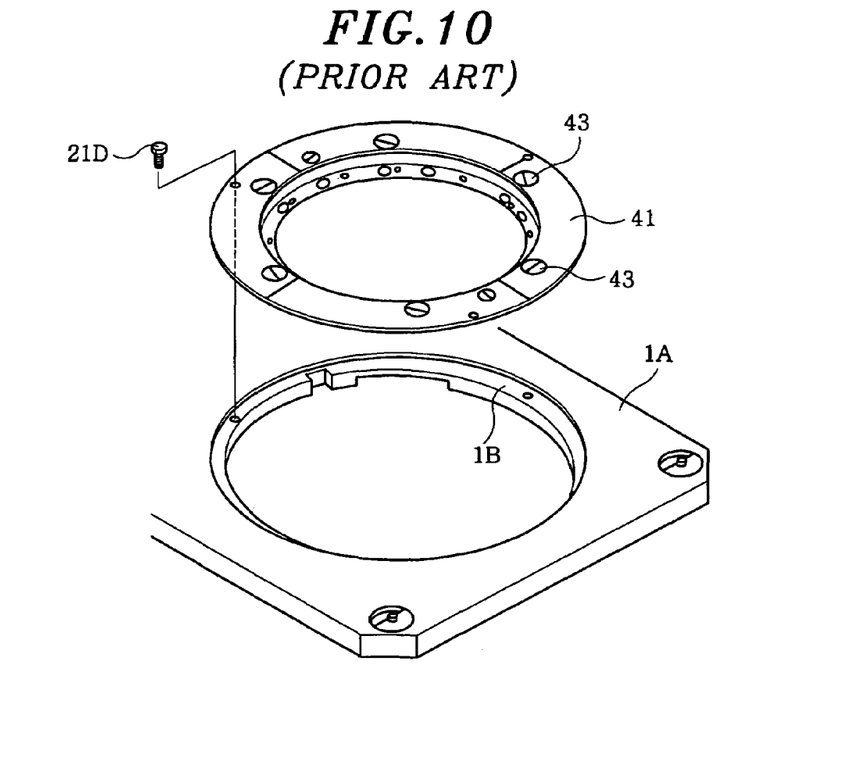
FIG. 10 represents an exploded perspective view showing a relationship between an insertion ring of a clamp mechanism and a head plate of the prior art, which are applied to the probe apparatus in FIG. 9.
Figure 11A:
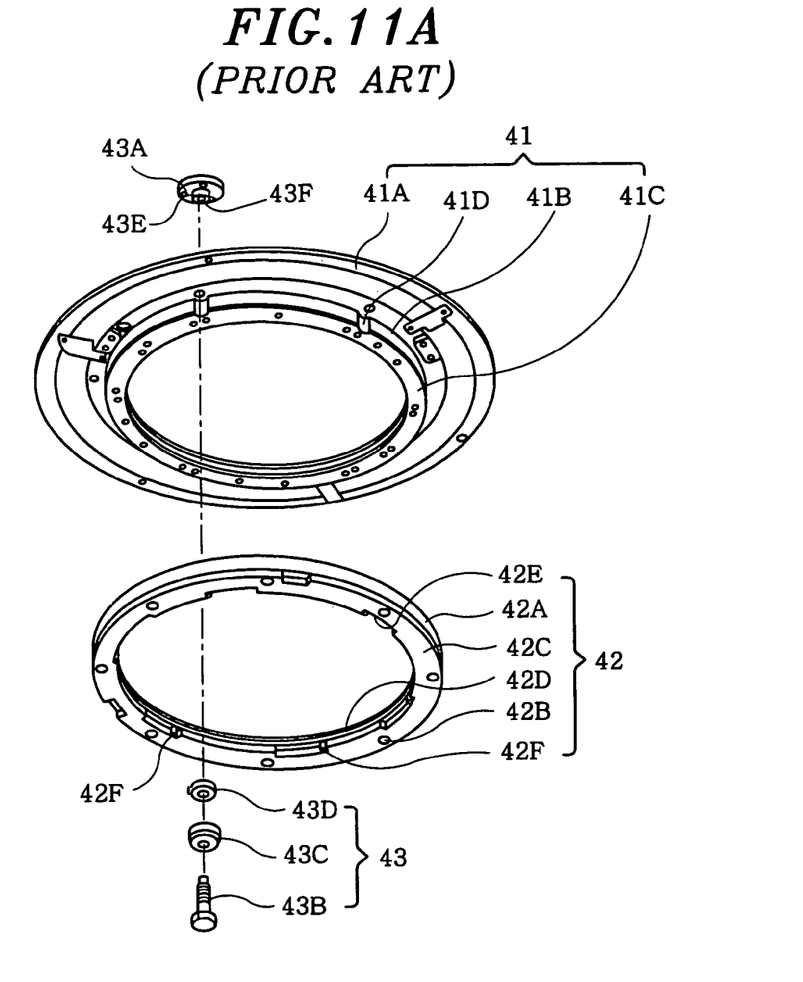
FIG. 11A is an exploded perspective view of the clamp mechanism.

The clamp mechanism 4 automatically clamps and fixes the probe card 3 transferred by a transfer mechanism. A clamp mechanism of this type is proposed in Japanese Patent Laid-open Application No. H10-189669 (Reference 1). As shown in FIGS. 10 and 11A, for example, the clamp mechanism 4 includes an insertion ring 41 being fixed on a flange portion 1B of a head plate 1A of the probe apparatus main body 1; a lock ring 42 rotatably attached to the bottom surface of the insertion ring 41, wherein the center of the lock ring 42 coincides with the center of the insertion ring 41; and a plurality of, e.g. six, V pulleys 43 for rotatably connecting the lock ring 42 with the insertion ring 41. In FIG. 11A, only one V pulley is shown.

As shown in FIGS. 10 and 11A, the insertion ring 41 includes a flange portion 41A engaged with the flange portion 1B of the head plate 1A; a substantially smooth cylindrical portion 41B vertically and downwardly extended from the inner periphery of the flange portion 41A; and a flange shaped clamp portion 41C horizontally and inwardly extended from the lower end of the cylindrical portion 41B for clamping the lock ring 42 and an engagement flange of the card holder to be described later. At the outer peripheral surface of the cylindrical portion 41B, six circular arc shaped recessed portions 41D are formed at equi-spaced intervals in a circumferential direction, and one V pulley 43 is rotatably arranged at each recessed portion 41D. The clamp portion 41C serves as a reference surface when fixing the probe card 3.

The lock ring 42 is formed to have an inner diameter allowing the cylindrical portion 41B of the insertion ring 41 to be inserted into the lock ring 42 with sufficient clearance. As shown in FIG. 11A, the lock ring 42 includes an upper ring 42A engaged with the radially inner part of the flange portion 41A of the insertion ring 41; and a lower ring 42C combined with the upper ring 42A by means of a force of springs (not shown) with a plurality of (e.g., four) joint pins 42B. Also, the lock ring 42 rotates clockwise and counterclockwise by two air cylinders (not shown). The inner diameter of the upper ring 42A is greater than that of the lower ring 42C, and the inner diameter of the lower ring 42C is greater than the outer diameter of the cylindrical portion 41B of the insertion ring 41. A V groove 42D, into which the six V pulleys 43 are inserted, is formed along the entire circumference of the inner peripheral surface of the upper ring 42A to allow the lock ring 42 to be freely rotatable with the V pulleys 43. In addition, the reference numeral 42F represents a cam follower for supporting the card holder.

Figure 11B:
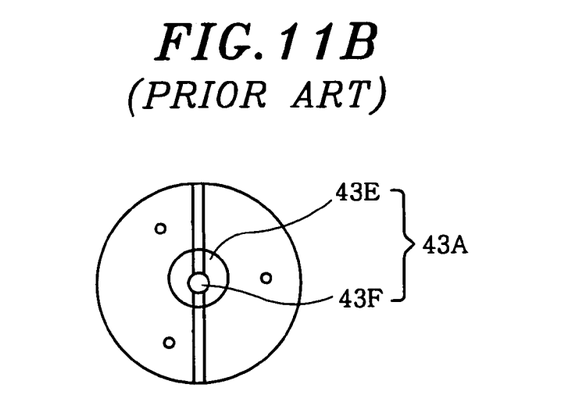
FIG. 11B is a plan view of a V pulley.

As shown in FIGS. 11A and 11B, each V pulley 43 includes a bearing nut 43A attached to the top surface of the insertion ring 41; a bearing pin 43B screwed into the bearing nut 43A from the lower side of the insertion ring 41; a pulley 43C rotatably supported by the bearing pin 43B; and a spacer 43D for adjusting the height of the pulley 43C. Further, as shown in the same drawings, an axis 43E being inserted into the hole of the insertion ring 41 is formed at the center of the bearing nut 43A, and a female screw portion 43F, into which the bearing pin 43B is screwed, is formed at a slightly eccentric position with respect to the center of the axis of the bearing nut 43A. Because the center of the axis of each bearing pin 43B is eccentric with respect to the center of the axis of corresponding bearing nut 43A, by rotating the bearing nuts 43A after attaching the V pulleys 43 to the insertion ring 41, the pulleys 43C can be engaged with the V groove of the inner peripheral surface of the lock ring 42 and the lock ring 42 can be combined with the insertion ring 41, or the engagement can be released and the lock ring 42 can be detached from the insertion ring 41.

In other words, when attaching the lock ring 42 to the insertion ring 41, the height of each V pulley 43 is adjusted by the spacer 43D, and the horizontal position of the lock ring 42 is adjusted by the directions of the bearing nuts 43A, so that the center of the axis of the lock ring 42 can coincide with the center of the axis of the insertion ring 41.

Further, a test head having a bearing mechanism for adjusting a connection state of the test head and a probe card is proposed in Japanese Patent Laid-open Application No. H8-102477 (Reference 2). The bearing mechanism has a test head main body and a support frame thereof. The test head main body is supported by bearings arranged at four corners of the support frame and capable of rotating horizontally in the support frame. Vertical and horizontal bearings of the bearing mechanism are rotatably attached to each attaching block. The horizontal position of the test head main body is regulated by the horizontal bearings and a vertical side of a guide block, and vertical position thereof is regulated by the vertical bearings and an upper and a lower guide block.

However, the probe card clamp mechanism of Reference 1 has some drawbacks as follows. First, the structure of the clamp mechanism is complex because the lock ring 42 is configured with a plurality of members such as the upper ring 42A, the lower ring 42B and so on. Further, both of the height and the horizontal position of the lock ring 42 with respect to the insertion ring 41 need to be adjusted by using the V pulleys 43 for attaching the lock ring 42 to the insertion ring 41. Moreover, it takes a long time to adjust the position of the lock ring 42 in the X, Y, and Z directions because the plural V pulleys 43 are arranged along the peripheral direction of the insertion ring 41 and the lock ring 42. Further, the test head of Reference 2 is not for a clamp mechanism, but for adjusting the connection state between the test head main body and the probe card. Thus, its mechanical structure is totally different from that of a clamp mechanism.

SUMMARY OF THE INVENTION

It is, therefore, an object of the present invention to provide a probe card clamp mechanism and probe apparatus, wherein the clamp mechanism has a simplified structure which can be produced with a low cost and can be attached to a probe apparatus main body by easy and rapid position adjustment.

In accordance with a first aspect of the present invention, there is provided a probe card clamp mechanism, which includes:

an insertion ring including a cylindrical portion, wherein a card holder of a probe card is attached to a lower end thereof, and a flange portion radially extending outwardly from an upper end portion of the cylindrical portion; and a lock ring, wherein an upper end portion thereof is inserted into an annular groove formed at a bottom surface of the flange portion of the insertion ring and a groove is formed around a circumference of an inner peripheral surface of the lock ring;

wherein, at the cylindrical portion of the insertion ring, first rollers inserted into the groove of the lock ring are arranged at three or more locations disposed at predetermined intervals along a circumferential direction thereof;

wherein, at the flange portion of the insertion ring, second rollers in contact with the inner peripheral surface of the lock ring are arranged at three or more locations disposed at predetermined intervals along a circumferential direction thereof; and wherein, at the lock ring, cutoff portions, through which the first rollers pass, are arranged corresponding to the first rollers.

The lock ring may be provided with support rollers for supporting protruded portions formed at the card holder at predetermined intervals along a circumferential direction thereof to thereby hold the protruded portions between the support rollers and the insertion ring.

Further, the first rollers may be arranged at three locations in pairs at each location.

The second rollers may be attached to the flange portion of the insertion ring to adjust a horizontal position of the lock ring.

The thickness of each protruded portion of the card holder may gradually increase along a circumferential direction thereof.

Further, the flange portion of the insertion ring may be provided with a sensor mechanism for detecting the protruded portions of the card holder.

The groove may be formed around the entire circumference of an inner peripheral surface of the lock ring.

In accordance with a second aspect of the present invention, there is provided a probe apparatus, which includes:

a movable mounting table on which an object to be inspected is mounted;

a probe card located above the mounting table; and the clamp mechanism in accordance with the first aspect of the present invention, which removably holds the probe card.

The clamp mechanism in accordance with the present invention has a simplified structure which can be produced with a low cost and can be attached to a probe apparatus main body by easy and rapid position adjustment.

BRIEF DESCRIPTION OF THE DRAWINGS

The above and other objects and features of the present invention will become apparent from the following description of preferred embodiments given in conjunction with the accompanying drawings, in which:

FIGS. 2A and 2B show an insertion ring shown in FIG. 1, wherein

FIGS. 4A and 4B show the lock ring shown in FIG. 1, wherein

FIGS. 5A and 5B present a relationship between the clamp mechanism and a card holder in FIG. 1, wherein

FIGS. 8A, 8B, and 8C describe cross sectional views showing a relationship between the card holder and the insertion ring, wherein FIG. 8A describes a cross sectional view showing a state in which a rotation stop pin is being inserted into a relief hole of the insertion ring.

FIGS. 11A and 11B present the clamp mechanism shown in FIG. 10, wherein

DETAILED DESCRIPTION OF THE PREFERRED EMBODIMENTS

Hereinafter, preferred embodiments of the present invention will be described in detail with reference to the accompanying drawings.

Figure 1:
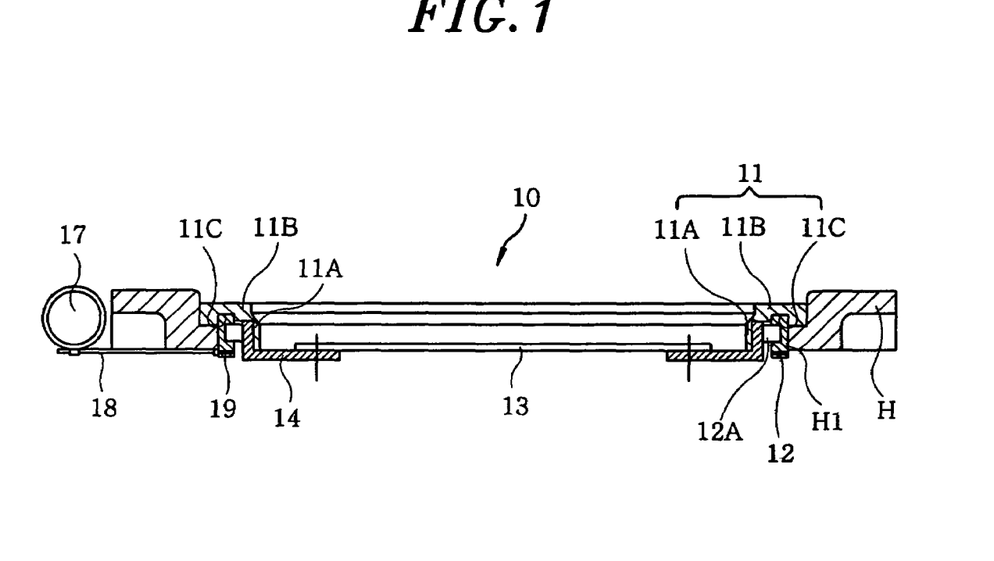
FIG. 1 is a cross sectional view showing an embodiment of a probe card clamp mechanism in accordance with the present invention.

As shown in FIG. 1, a probe card clamp mechanism (hereinafter, shortly referred to as a clamp mechanism) 10 in accordance with an embodiment of the present invention includes an insertion ring 11 having a cylindrical portion 11A and a flange portion 11B radially extending outwardly from the upper end portion of the cylindrical portion 11A; and a lock ring 12, wherein an upper end portion thereof is inserted into an annular groove 11C formed at a bottom surface of the flange portion 11B of the insertion ring 11. The clamp mechanism 10 is mounted on an opening portion H1 formed at a head plate H with the flange portion 11B of the insertion ring 11 and holds a probe card 13 by means of the insertion ring 11 and the lock ring 12 with a card holder 14, as described below.

Figure 2A:
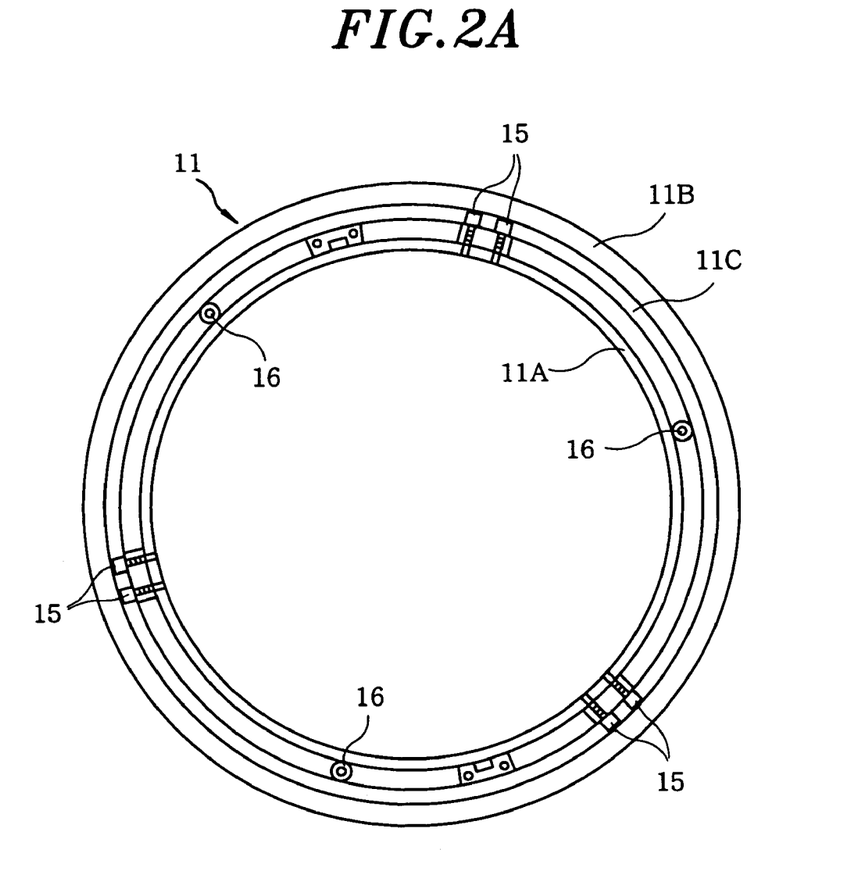
FIG. 2A is a bottom view of the insertion ring.
Figure 2B:
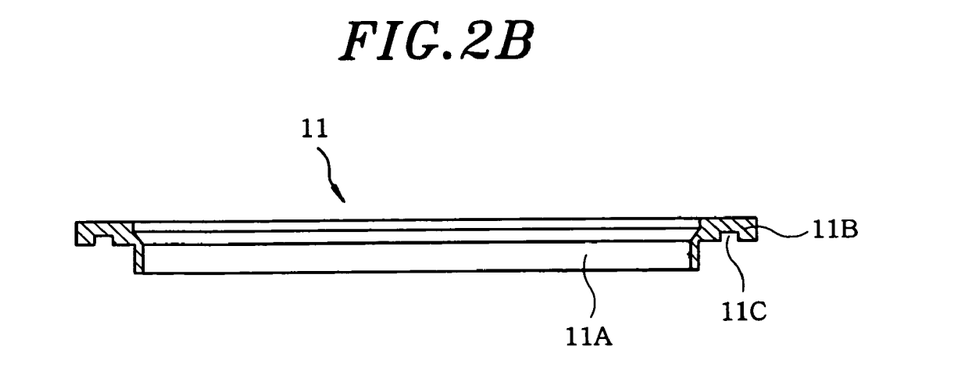
FIG. 2B is a cross sectional view of same.
Figure 3A:
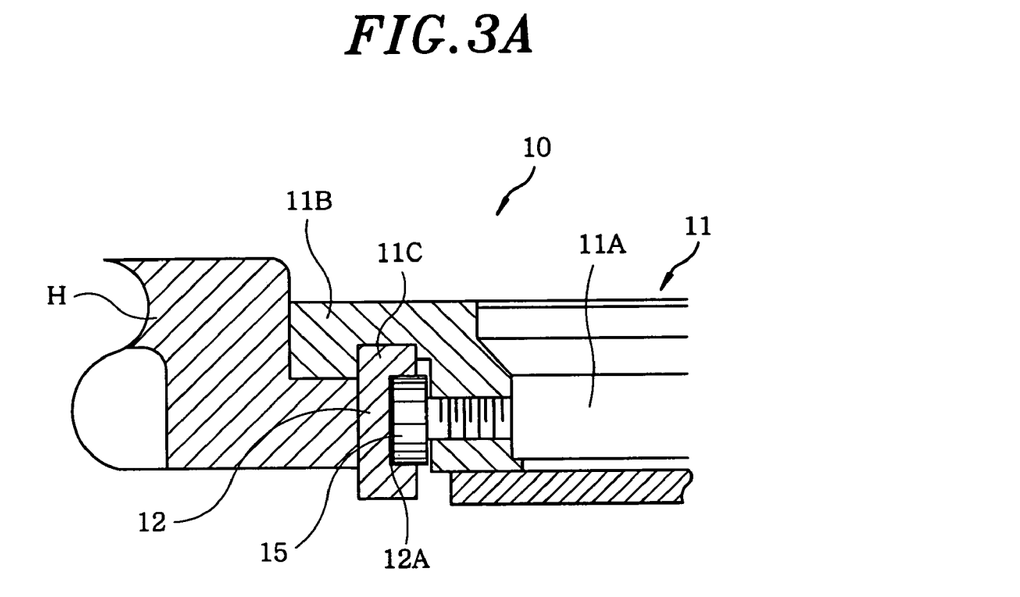
FIGS. 3A and 3B provide a cross sectional views of main parts illustrating a relationship between the insertion ring and a lock ring shown in FIG. 1, wherein FIG. 3A provides a cross sectional view showing a relationship between a first cam follower of the insertion ring and the lock ring, and FIG. 3B provides a cross sectional view showing a relationship between a second cam follower of the insertion ring and the lock ring.

A groove 12A is formed approximately at the center in a width direction along the entire circumference of the inner peripheral surface of the lock ring 12 and serves as a cam. Further, as shown in FIGS. 2A and 3A, at the cylindrical portion 11A of the insertion ring 11, first rollers (hereinafter, referred to as first cam followers) 15 being inserted into the groove 12A of the lock ring 12 are arranged at three or more locations (three locations in the present embodiment) disposed at predetermined intervals along a circumferential direction of the cylindrical portion 11A and hold the lock ring 12 at a predetermined height, wherein the first cam followers 15 are disposed in pairs at each location. In FIG. 2A, the first cam followers 15 are arranged in pairs at each of the three locations, but only one first cam follower 15 may be arranged at each location. By arranging the first cam followers 15 at three locations, the lock ring 12 can be supported evenly by all of the first cam followers 15. Besides, though the first cam followers 15 receive a heavy load while clamping the probe card 13, a mechanical strength can be obtained by arranging the first cam followers 15 in pairs at each location.

Figure 3B:
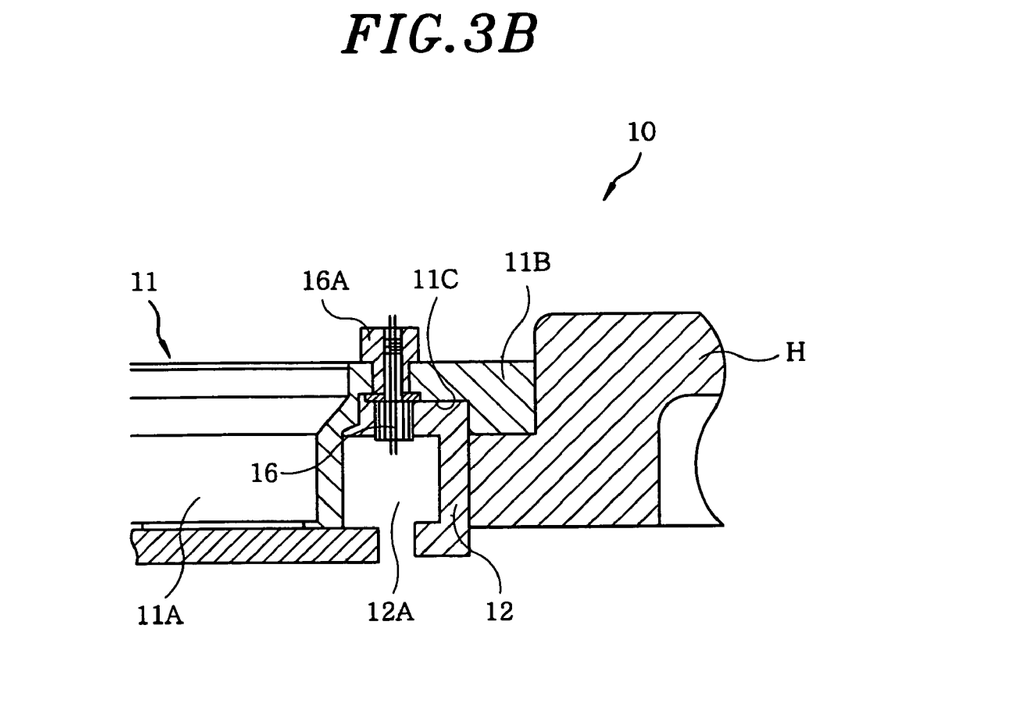

Further, as shown in FIGS. 2A and 3B, at the flange portion 11B of the insertion ring 11, second rollers (hereinafter, referred to as second cam followers) 16 in contact with the inner peripheral surface above the groove 12A of the lock ring 12 are arranged at three or more locations (three locations in FIG. 2A) disposed at predetermined intervals along a circumferential direction of the flange portion 11B. As shown in FIG. 3B, the second cam followers 16 serve to adjust the contact level with the inner peripheral surface of the lock ring 12 while the first cam followers 15 hold the lock ring 12 at the predetermined height. In detail, each second cam follower 16 is connected with a position adjusting member 16A rotatably arranged on the top surface of the flange portion 11B of the insertion ring 11 and is attached to or detached from the lock ring 12 by rotating the position adjusting member 16A, as shown in FIG. 3B. The axis of each second cam follower 16 is screwed with the position adjusting member 16A at an eccentric position with respect to the center of the axis of the position adjusting member 16A, as shown in FIG. 3B; therefore, each second cam follower 16 rotates around the center of the axis of the position adjusting member 16A to move toward or away from the inner peripheral surface of the lock ring 12 by rotating the position adjusting member 16A. Thus, the contact state between each second cam follower 16 and the inner peripheral surface of the lock ring 12 can be adjusted by rotating the position adjusting member 16A, so that the horizontal position (X and Y position) of the lock ring 12 with respect to the insertion ring 11 can be adjusted, enabling the center of the axis of the lock ring 12 to coincide with that of the insertion ring 11.

Figure 4A:
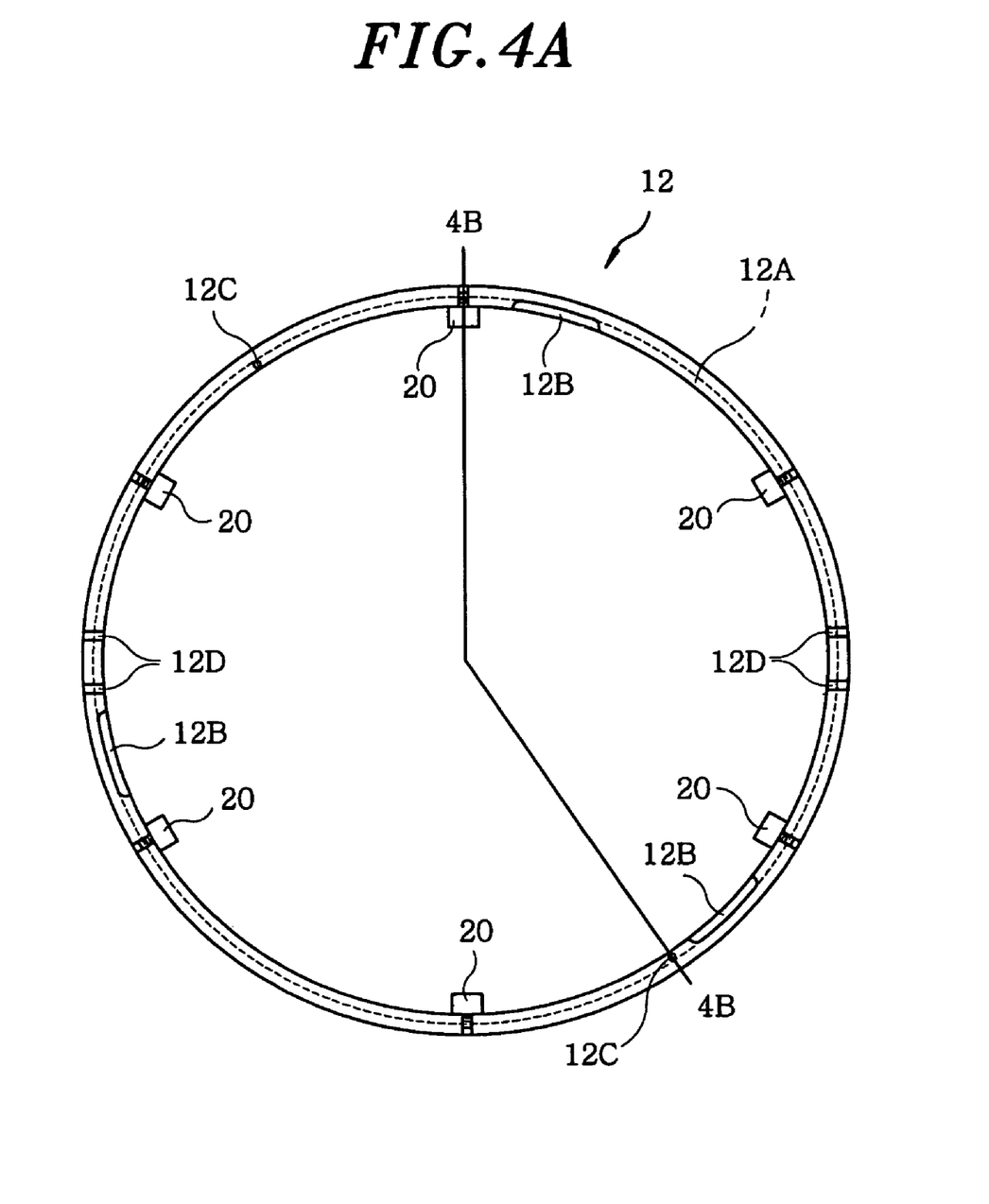
FIG. 4A is a bottom view of the lock ring.
Figure 4B:
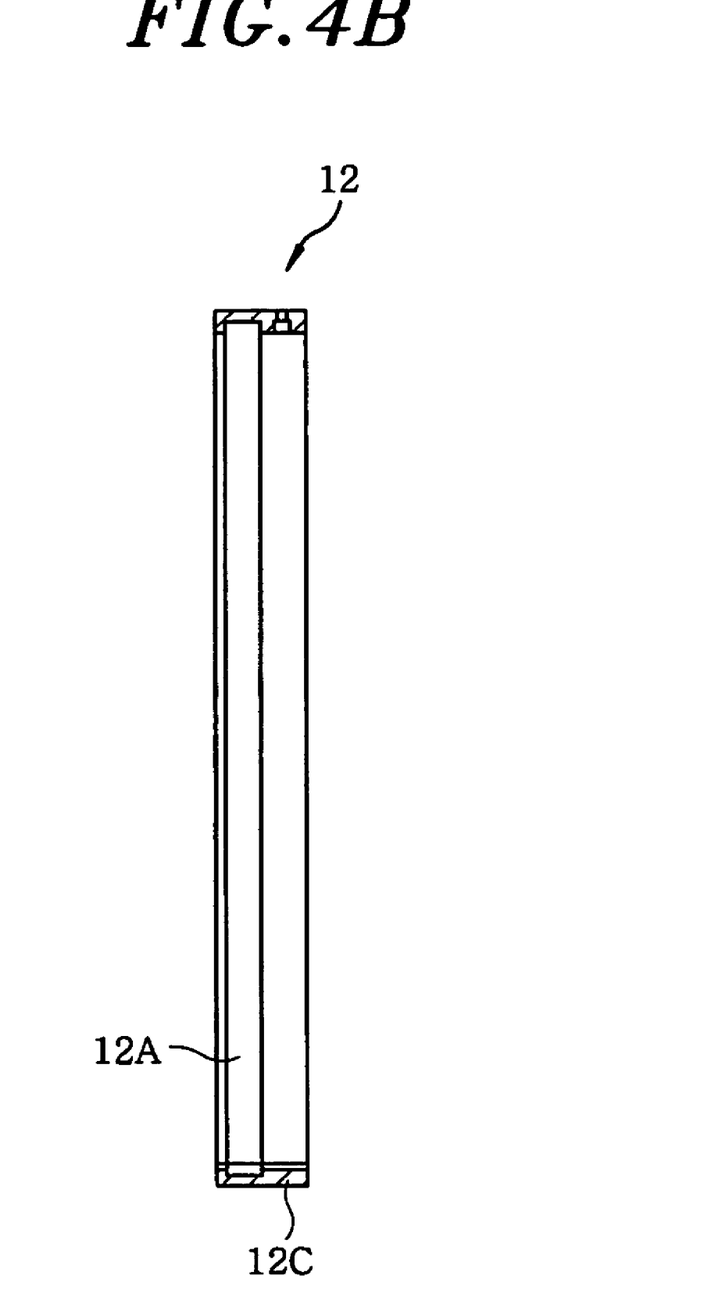
FIG. 4B is a cross sectional view taken along the line 4B-4B of FIG. 4A.

At the lock ring 12, cutoff portions 12B corresponding to the first cam followers 15 are formed at predetermined intervals (e.g., 120°) along a circumferential direction of the lock ring 12, as shown in FIG. 4A. When attaching the lock ring 12 to the insertion ring 11, the first cam followers 15 of the insertion ring 11 pass through corresponding cutoff portions 12B, and then the first cam followers 15 move away from the cutoff portions 12B into the cutoff-free portions of the groove 12A of the lock ring 12 by rotating the lock ring 12 while the upper end portion of the lock ring 12 is inserted into the annular groove 11C of the insertion ring 11.

In addition, at the lock ring 12, two positioning holes 12C, into which first positioning pins (not shown) for locking the position of the lock ring 12 with respect to the insertion ring 11 are inserted, are formed at two locations spaced apart from each other at an angle of 180° along a circumferential direction of the lock ring 12; and two positioning holes (not shown) corresponding to the positioning holes 12C are also formed at the insertion ring 11. Accordingly, the insertion ring 11 and the lock ring 12 can be combined in a predetermined positional relationship by inserting the first positioning pins into the corresponding positioning holes 12C and those of the insertion ring 11 after the lock ring 12 is rotatably combined with the insertion ring 11. A motor 17 for rotating the lock ring 12 can be connected with the lock ring 12 as shown in FIG. 1 after locking the position of the insertion ring 11 and the lock ring 12.

That is, as shown in FIG. 1, the motor 17 and a ball screw (not shown) connected with the motor 17 are arranged at horizontally outside of the head plate H and the ball screw is screwed into a nut member (not shown). Further, one end of a coupling plate 18 arranged at an under portion of the groove 12A of the lock ring 12 is connected with the nut member and the opposite end of the coupling plate 18 is connected with the lock ring 12 by screw members 19. Moreover, a shutter (not shown) is arranged at the nut member and the motor 17 can be stopped by detecting the shutter with a transmission sensor (not shown) arranged on the head plate H. This allows a clockwise and counterclockwise rotation of the motor 17 to be transformed into a forward and backward linear movement of one end portion of the coupling plate 18 by the ball screw and the nut member; and as a result, the lock ring 12 can rotate clockwise and counterclockwise within a predetermined angle range. The screw members 19 are screwed into two female screw portions 12D formed through the under portion of the groove 12A of the lock ring 12 in a diametrical direction as shown in FIG. 4A to connect the coupling plate 18 with the lock ring 12.

Figure 5A:
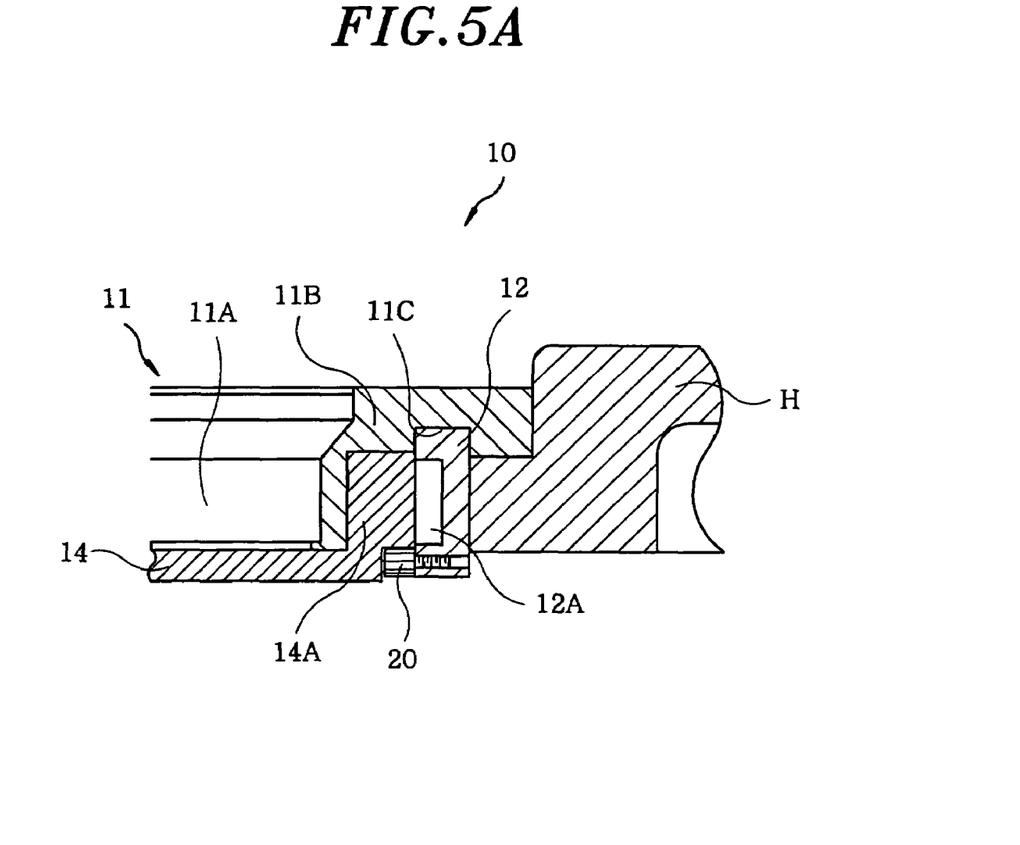
FIG. 5A presents a cross sectional view of main parts thereof.

Further, as shown in FIGS. 4A and 5A, the lock ring 12 is provided with a plurality of (six in FIG. 4A) support rollers (hereinafter, referred to as support cam followers) 20 attached at predetermined intervals in a circumferential direction thereof; and as shown in FIG. 5A, protruded portions 14A corresponding to the support cam followers 20 are formed at the card holder 14. The probe card 13 is supported by the support cam followers 20 with the card holder 14 and is attached to or detached from the cylindrical portion 11A of the insertion ring 11 depending on the clockwise and counterclockwise rotation of the lock ring 12.

Figure 5B:
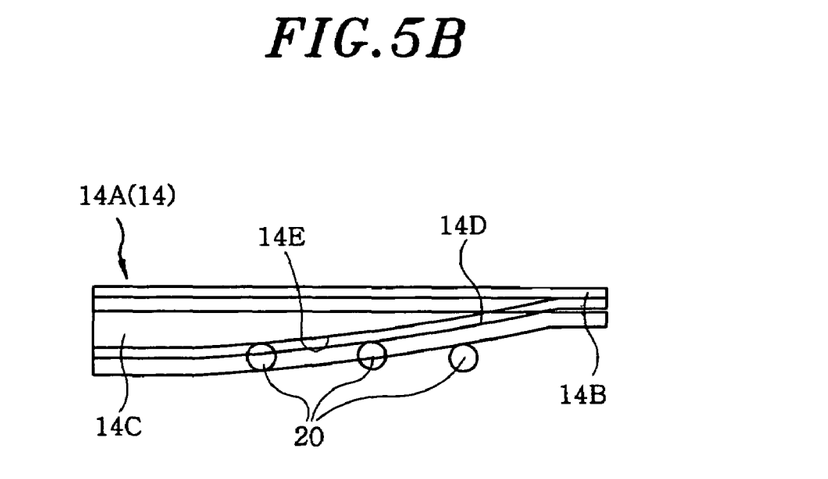
FIG. 5B presents an explanatory diagram showing a relationship between a protruded portion of the card holder and a support cam follower.

As shown in FIG. 5B, each protruded portion 14A of the card holder 14 includes a thin body portion 14B formed at one end portion (right end portion in FIG. 5B) of the protruded portion 14A to be the thinnest portion thereof; a thick body portion 14C formed at the opposite end portion (left end portion in FIG. 5B) of the protruded portion 14A to be the thickest portion thereof; and a first and a second inclined portions 14D and 14E, respectively, formed as approaching the thick body portion 14C from the thin body portion 14B while changing the inclined angle in two stages. Accordingly, as the lock ring 12 rotates, each support cam follower 20 moves from the thin body portion 14B of the protruded portion 14A to the thick body portion 14C thereof to gradually elevate the probe card 13 (see FIGS. 6A to 6C).

Finally, as shown in FIG. 5A, the probe card 13 is held by the support cam followers 20 and the flange portion 11B of the insertion ring 11.

Figure 6A:
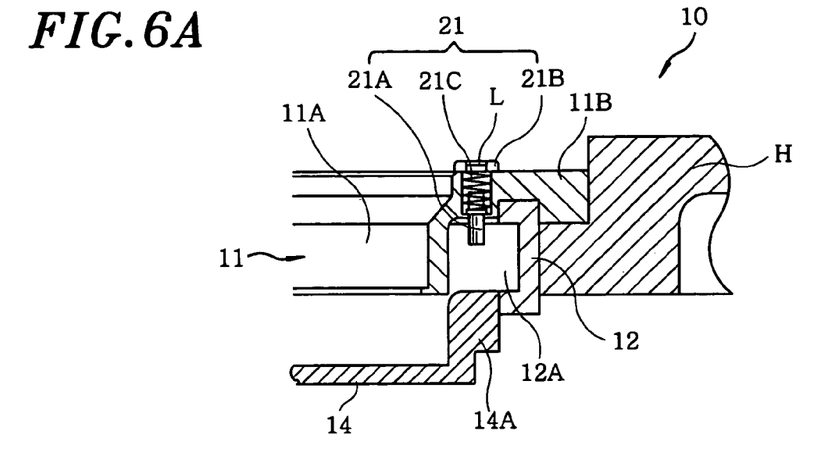
FIGS. 6A, 6B, and 6C illustrate a process for fixing the probe card using the clamp mechanism.
Figure 6B:
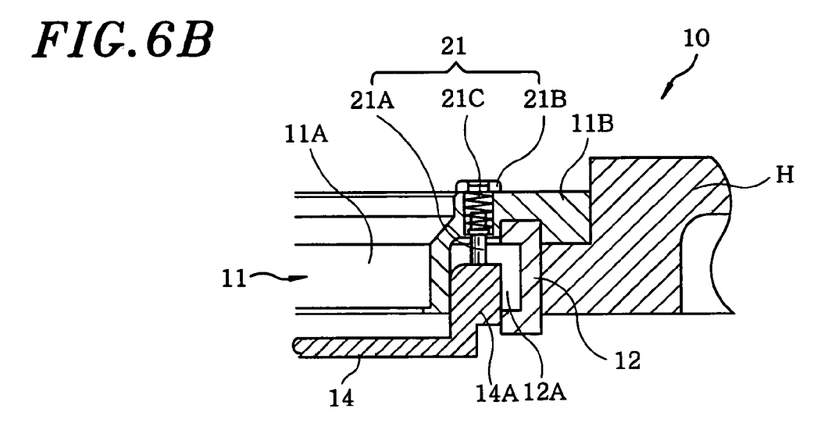
Figure 6C:
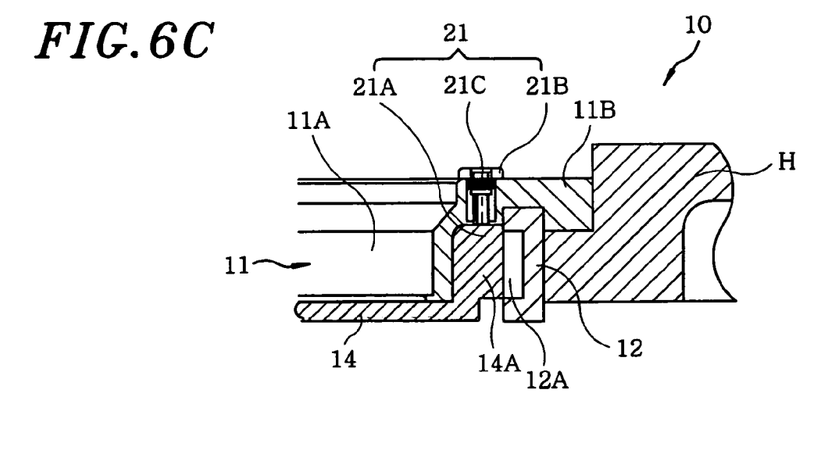

Further, as shown in FIGS. 6A to 6C, the insertion ring 11 is provided with a sensor mechanism 21 for detecting the card holder 14, wherein, e.g., one of the thick body portions 14C of the protruded portions 14A, is positioned below the sensor mechanism 21. As shown in FIGS. 6A to 6C, the sensor mechanism 21 includes a pin 21A housed within a through hole formed in the flange portion 11B of the insertion ring 11; a plate sensor 21B arranged to place the through hole inbetween a U-shaped cutoff portion; and a spring 21C elastically arranged between the pin 21A and the plate sensor 21B. The sensor mechanism 21 detects the card holder 14 with the pin 21A. At the lower end portion of the through hole, a protruded portion extended inwardly is formed, and thus the pin 21A is engaged with the protruded portion by a flange portion formed on a straight barrel portion of the pin 21A. The plate sensor 21B at the cutoff portion has a sensor part and is a transmission sensor for contactlessly detecting the pin 21A entering and leaving the cutoff portion by the sensor part. The sensor part, for example, includes a light emitting element and a light receiving element, and detects the existence or nonexistence of the card holder 14 by identifying whether or not a light L emitted from the light emitting element is detected by the light receiving element.

Figure 7:
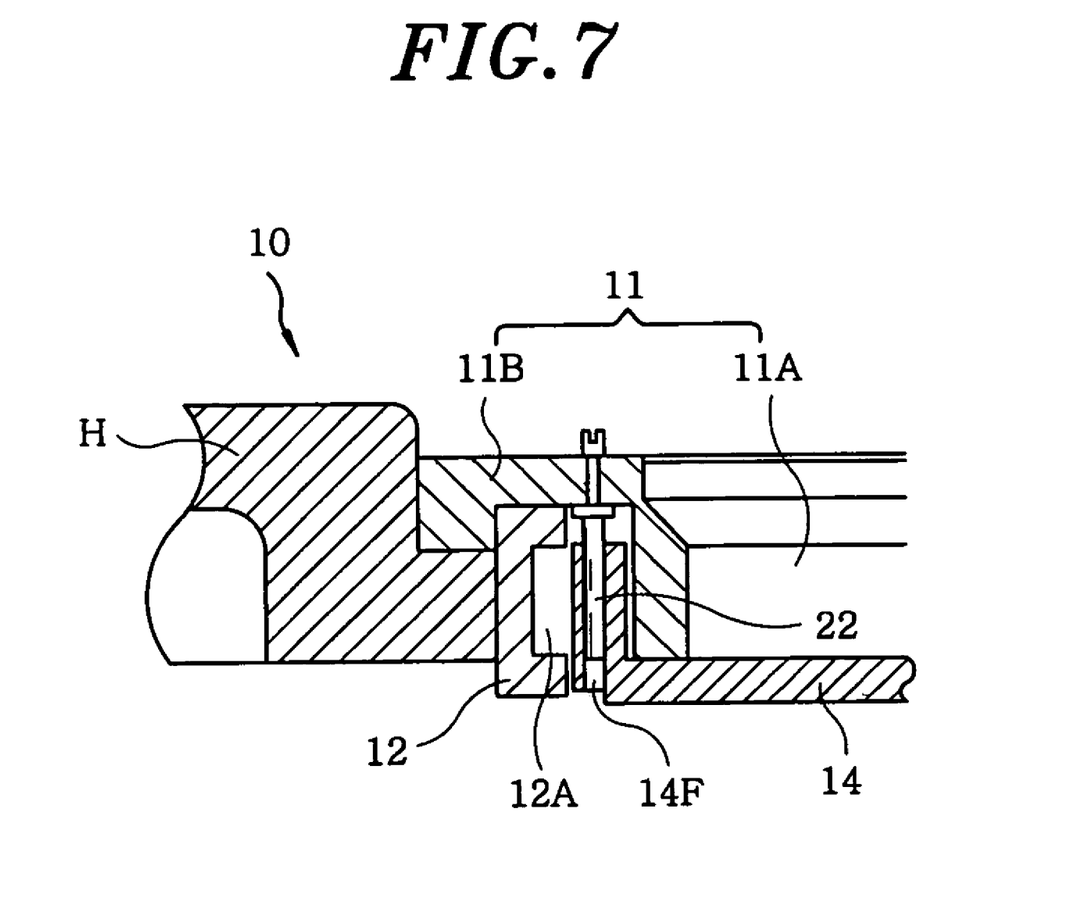
FIG. 7 offers a cross sectional view showing a relationship between a second positioning pin of the insertion ring and the card holder.

As shown in FIG. 7, two second positioning pins 22 are attached to the flange portion 11B of the insertion ring 11 in a manner of being spaced apart from each other at an angle of 180° along a circumferential direction thereof and vertically drop along the cylindrical portion 11A. Also, at the card holder 14, two insertion holes 14F corresponding to the second positioning pins 22 are formed. When attaching the probe card 13 to the clamp mechanism 10, each second positioning pin 22 at the side of the insertion ring 11 is inserted into the corresponding insertion holes 14F of the card holder 14, thereby accurately setting a circumferential position of the probe card 13 with respect to the insertion ring 11.

Figure 8A:
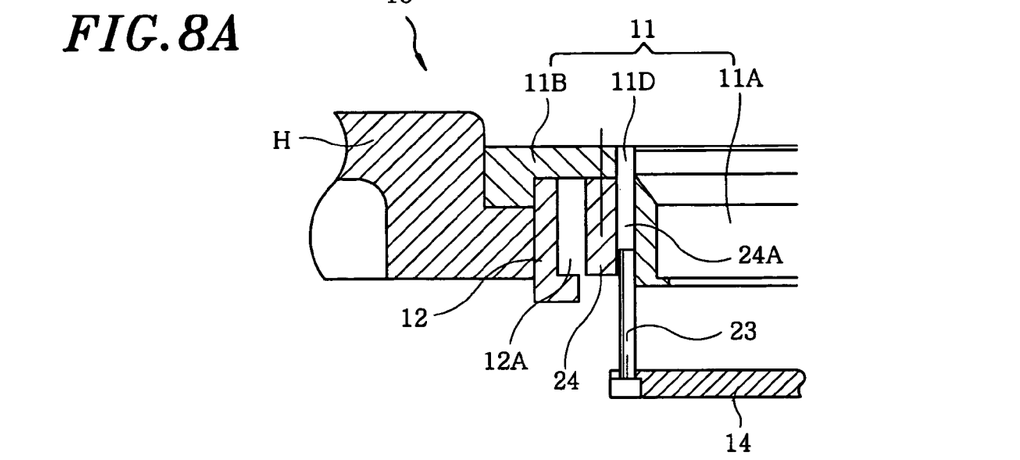
Figure 8B:
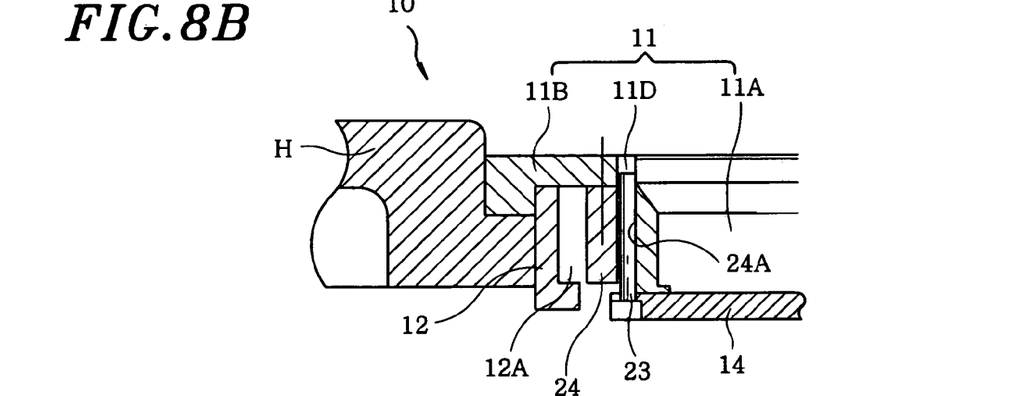
FIG. 8B describes a cross sectional view showing a state in which the rotation stop pin has been inserted into the relief hole of the insertion ring.
Figure 8C:
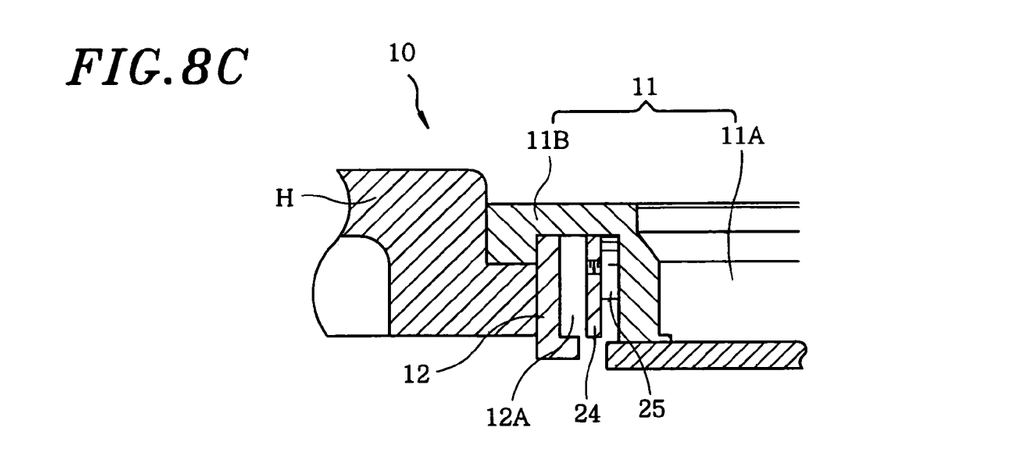
FIG. 8C describes a cross sectional view showing a cam follower disposed adjacent to the rotation stop pin in FIGS. 8A and 8B.

Moreover, at a protruded portion of the card holder 14 extending outwardly compared with the cylindrical portion 11A of the insertion ring 11, two rotation stop pins 23 spaced apart from each other at an angle of 180° along a circumferential direction of the card holder 14 are provided upright, as shown in FIGS. 8A and 8B. Also, blocks 24 are attached at the bottom surface of the flange portion 11B of the insertion ring 11, and relief holes 24A and 11D where the rotation stop pins 23 are loosely inserted are formed at the blocks 24 and the flange portion 11B, respectively. Further, at each block 24, a cam follower 25, whose position is capable of being adjusted along a circumferential direction of the insertion ring 11, is attached to protrude toward the cylindrical portion 11A, and the circumferential position of the cam follower 25 with respect to the insertion ring 11 is determined to be engaged with the rotation stop pins 23, as shown in FIG. 8C.

Accordingly, as shown in FIG. 6A, if the lock ring 12 rotates due to an operation of the motor 17 after the protruded portions 14A of the card holder 14 are inserted into the gap between the cylindrical portion 11A of the insertion ring 11 and the lock ring 12, the thin body portions 14B of the protruded portions 14A come into contact with the support cam followers 20. After this, if the support cam follower 20 moves from the thin body portion 14B and continuously along the first and the second inclined portions 14D and 14E, respectively, due to the rotation of the lock ring 12 by the motor 17 as shown in FIG. 5B, the pin 21A of the sensor part 21 comes into contact with the top surface of the protruded portion 14A as shown in FIG. 6B, and then the card holder 14 is elevated slowly while resisting the elasticity of the spring 21B. Finally, as shown in FIGS. 5A and 6C, the card holder 14 reaches its rising end.

The rotational movement of the motor 17 is transformed into the linear movement of the coupling plate 18 by the ball screw and the nut member and the lock ring 12 rotates by the linear movement of the coupling plate 18. The linear movement of the coupling plate 18 rotates the lock ring 12. If the position of the shutter is contactlessly detected by the transmission sensor, the position of the lock ring 12 is set by stopping the motor 17. When the motor 17 stops, each protruded portion 14A of the card holder 14 is fixedly interposed between the support cam follower 20 and the flange portion 11B of the insertion ring 11, and as a result, the card holder 14 is held by the clamp mechanism 10. At this time, each second positioning pin 22 of the insertion ring 11 is inserted into a corresponding insertion hole 14F formed at the card holder 14. The plate sensor 21B of the sensor mechanism 21 detects the pin 21A entered the cutoff portion as shown in FIG. 6C.

Hereinafter, the assembly of the clamp mechanism 10 will be described. First of all, the first cam followers 15, the second cam followers 16, the position adjusting members 16A, and other components are attached to their respective predetermined positions of the insertion ring 11; and the support cam followers 20 and other components are attached to their respective predetermined positions of the lock ring 12. Subsequently, the insertion ring 11 and the lock ring 12 are combined. In detail, by inserting the cylindrical portion 11A of the insertion ring 11 into the lock ring 12 after fitting the cutoff portions 12B of the lock ring 12 to the first cam followers 15 of the insertion ring 11, the upper end portion of the lock ring 12 is inserted into the annular groove 11C formed on the flange portion 11B of the insertion ring 11. In such state, by rotating the lock ring 12, the first cam followers 15 move away from the cutoff portions 12B into the cutoff-free portions of the groove 12A of the lock ring 12. Thus, the lock ring 12 is rotatably combined with the insertion ring 11 and the height of the lock ring 12 is automatically set.

Thereafter, the circumferential positioning of the insertion ring 11 and the lock ring 12 is performed by inserting the first positioning pins into the positioning holes of the insertion ring 11 by rotating the lock ring 12 after inserting the first positioning pins into the positioning holes 12C of the lock ring 12. At this time, the height of the lock ring 12 has been already set by the first cam followers 15 and the groove 12A of the lock ring 12. After this, by rotating the position adjusting members 16A disposed at three locations to adjust the contacting pressures between the respective second cam followers 16 and the lock ring 12 to be even, the X and Y position of the lock ring 12 with respect to the insertion ring 11 is set. At this time, the lock ring 12 can be attached to the insertion ring 11 by simply adjusting the X and Y position thereof with the position adjusting members 16A without concerning for the height of the lock ring 12. The assembly of the clamp mechanism 10 is then completed.

After the X, Y, and Z position of the insertion ring 11 and the lock ring 12 is set as mentioned above, the first positioning pins are removed from the clamp mechanism 10 and the second positioning pins 22 are attached to the flange portion 11B; and then the clamp mechanism 10 is fixed on the opening portion H1 of the head plate H with the flange portion 11B of the insertion ring 11. Subsequently, the nut member screw-coupled with the ball screw already arranged at the head plate H at the side of the motor 17 is connected with the lock ring 12 by the coupling plate 18 and the screw member 19. Next, the card holder 14 to which the rotation stop pins 23 are attached is attached to the lock ring 12. At this time, the clamp mechanism 10 clamps the protruded portions 14A of the card holder 14 by the operation of the motor 17, and then the card holder 14 is fixed on the clamp mechanism 10. To fix the card holder 14 on the clamp mechanism 10, the position of the cam follower 25 with respect to the rotation stop pins 23 of the card holder 14 is adjusted at the side of the insertion ring 11. By adjusting the circumferential position of the cam follower 25, the rotation stop pins 23 come in contact with the cam follower 25 when the support cam followers 20 rotate along the protruded portions 14A of the card holder 14 by the operation of the motor 17, thereby elevating the card holder 14 without rotating it.

As described above, in accordance with the embodiment of the present invention, the height of the lock ring 12 with respect to the insertion ring 11 can be automatically set by having the first cam followers 15 of the insertion ring 11 move into the groove 12A of the lock ring 12. Further, the X and Y position of the lock ring 12 with respect to the insertion ring 11 can be set by simply adjusting the contact level between each second cam follower 16 and the inner peripheral surface of the lock ring 12 with the three position adjusting members 16A of the insertion ring 11 without concerning for the height of the lock ring 12. That is, the only adjusting process necessary for attaching the lock ring 12 to the insertion ring 11 is adjusting the X and Y position with the second cam followers 16, thereby assembling the clamp mechanism 10 quickly and simplifying the assembly process.

Further, in accordance with the embodiment of the present invention, there are some following advantages. First, there remains no damage if the probe card 13 receives a heavy load when clamping the probe card 13 because the lock ring 12 can be supported evenly by all of the first cam followers 15 arranged at three locations in pairs. Second, the X and Y position of the lock ring 12 can be set accurately by simply adjusting the second cam followers 16 because the second cam followers 16 are attached to the flange portion 11B of the insertion ring 11 while being capable of adjusting the horizontal position of the lock ring 12. Third, the probe card 13 can be fixed on the clamp mechanism 10 by simply rotating the lock ring 12 because the thickness of each protruded portion 14A of the card holder 14 gradually increases along a circumferential direction thereof. Lastly, whether or not the clamp mechanism 10 holds the probe card 13 can be detected automatically because the sensor mechanism 21 for detecting the protruded portions 14A of the card holder 14 is arranged at the flange portion 11B of the insertion ring 11.

Moreover, the present invention is not limited to the aforementioned embodiment and the respective components can be modified as occasion demands.

The present invention is suitably used for a probe apparatus.

While the invention has been shown and described with respect to the preferred embodiments, it will be understood by those skilled in the art that various changes and modifications may be made without departing from the scope of the invention as defined in the following claims.

What is claimed is:

1. A probe card clamp mechanism, comprising:
   an insertion ring including a cylindrical portion, wherein a card holder of a probe card is attached to a lower end thereof, and a flange portion radially extending outwardly from an upper end portion of the cylindrical portion; and
   a lock ring, wherein an upper end portion thereof is inserted into an annular groove formed at a bottom surface of the flange portion of the insertion ring and a groove is formed around a circumference of an inner peripheral surface of the lock ring;
   wherein, at the cylindrical portion of the insertion ring, first rollers inserted into the groove of the lock ring are arranged at three or more locations disposed at predetermined intervals along a circumferential direction thereof;
   wherein, at the flange portion of the insertion ring, second rollers in contact with the inner peripheral surface of the lock ring are arranged at three or more locations disposed at predetermined intervals along a circumferential direction thereof; and
   wherein, at the lock ring, cutoff portions, through which the first rollers pass, are arranged corresponding to the first rollers.

2. The mechanism of claim 1, wherein the lock ring is provided with support rollers for supporting protruded portions formed at the card holder at predetermined intervals along a circumferential direction thereof to thereby hold the protruded portions between the support rollers and the insertion ring.

3. The mechanism of claim 1, wherein the first rollers are arranged at three locations in pairs at each location.

4. The mechanism of claim 1, wherein the second rollers are attached to the flange portion of the insertion ring to adjust a horizontal position of the lock ring.

5. The mechanism of claim 2, wherein the thickness of each protruded portion of the card holder gradually increases along a circumferential direction thereof.

6. The mechanism of claim 2, wherein the flange portion of the insertion ring is provided with a sensor mechanism for detecting the protruded portions of the card holder.

7. The mechanism of claim 1, wherein the groove is formed around the entire circumference of an inner peripheral surface of the lock ring.

8. A probe apparatus, comprising:
   a movable mounting table on which an object to be inspected is mounted;
   a probe card located above the mounting table; and
   the probe card clamp mechanism, which removably holds the probe card, described in claim 1.

* * * * *